(12) United States Patent
Luo et al.

(10) Patent No.: US 9,590,610 B2
(45) Date of Patent: Mar. 7, 2017

(54) DRIVER CIRCUIT FOR SIGNAL TRANSMISSION AND CONTROL METHOD OF DRIVER CIRCUIT

(71) Applicant: MEDIATEK INC., Hsin-Chu (TW)

(72) Inventors: Yan-Bin Luo, Taipei (TW); Chien-Hua Wu, Taipei (TW); Chung-Shi Lin, Hsinchu (TW); Chih-Hsien Lin, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 6 days.

(21) Appl. No.: 14/822,913

(22) Filed: Aug. 11, 2015

(65) Prior Publication Data

US 2016/0191037 A1   Jun. 30, 2016

Related U.S. Application Data

(60) Provisional application No. 62/097,788, filed on Dec. 30, 2014.

(51) Int. Cl.
    H03K 17/10    (2006.01)
    H04L 25/02    (2006.01)
    H04L 25/49    (2006.01)

(52) U.S. Cl.
    CPC ......... *H03K 17/10* (2013.01); *H04L 25/0272* (2013.01); *H04L 25/0282* (2013.01); *H04L 25/4906* (2013.01)

(58) Field of Classification Search
    CPC .................................................. H03K 17/00
    See application file for complete search history.

(56) References Cited

U.S. PATENT DOCUMENTS 6,025,742 A * 2/2000 Chan ............. H03K 19/018528
                                                    326/30
6,686,772 B2    2/2004 Li
(Continued)

FOREIGN PATENT DOCUMENTS

CN          1697339 A      11/2005

OTHER PUBLICATIONS

Chien-Hua et al., Title: Driver Circuit for Signal Transmission and Control Method of Driver Circuit, pending U.S. Appl. No. 15/069,880, filed Mar. 14, 2016.
(Continued)

*Primary Examiner* — Hai L Nguyen
(74) *Attorney, Agent, or Firm* — Winston Hsu; Scott Margo

(57) ABSTRACT

A driver circuit for receiving input data and generating an output signal to a termination element is disclosed, wherein the input data has a first bit and second bit, and the driver circuit includes: a pair of differential output terminals, arranged for outputting the output signal, wherein the pair of differential output terminals has a first output terminal and a second output terminal; a current mode drive unit, coupled to the pair of differential output terminals, for outputting a current from one of the first output terminal and the second output terminal, and receiving the current from the other of the first output terminal and the second output terminal according to the first bit; and a voltage mode drive unit, coupled to the pair of differential output terminals, for providing voltages to the first output terminal and the second output terminal according to at least the second bit.

19 Claims, 4 Drawing Sheets

(56) References Cited

U.S. PATENT DOCUMENTS

| | | |
|---|---|---|
| 6,812,733 B1 | 11/2004 | Plasterer |
| 7,012,450 B1 | 3/2006 | Oner |
| 7,298,173 B1 | 11/2007 | Jiang |
| 7,514,968 B1 | 4/2009 | Lai |
| 7,719,314 B1 | 5/2010 | Jiang |
| 7,848,038 B1 | 12/2010 | Tan |
| 7,990,178 B2 | 8/2011 | Liu |
| 8,115,515 B2 | 2/2012 | Roper |
| 8,446,172 B2 | 5/2013 | Chan |
| 8,487,654 B1 | 7/2013 | Chen |
| 9,312,846 B2 * | 4/2016 | Wu .................. H03K 17/16 |
| 2004/0246613 A1 | 12/2004 | Tseng |
| 2006/0208774 A1 | 9/2006 | Leonowich |
| 2006/0290439 A1 | 12/2006 | Martin |
| 2007/0002954 A1 | 1/2007 | Cornelius |
| 2008/0034378 A1 | 2/2008 | Kumar |
| 2009/0203333 A1 | 8/2009 | Jeffries |
| 2012/0299618 A1 | 11/2012 | Sayuk |
| 2013/0076404 A1 | 3/2013 | Lee |
| 2013/0257488 A1 | 10/2013 | Sayuk |
| 2015/0022243 A1 | 1/2015 | Wu |

OTHER PUBLICATIONS

Yan-Bin Luo et al., Title: Driver Circuit With Feed-Forward Equalizer, pending U.S. Appl. No. 14/825,149, filed Aug. 12, 2015.

* cited by examiner

DRIVER CIRCUIT FOR SIGNAL TRANSMISSION AND CONTROL METHOD OF DRIVER CIRCUIT

CROSS REFERENCE TO RELATED APPLICATIONS

This application claims the priority of U.S. Provisional Application No. 62/097,788, filed on Dec. 30, 2014, which is included herein by reference in its entirety.

BACKGROUND

The disclosed embodiments of the present invention relate to signal driving scheme, and more particularly, to a driver circuit used for signal transmission and a related control method.

Traditional serializer/deserializer (SerDes) designs employ driver circuits including a current mode logic (CML) driver, a voltage mode driver, and an H-bridge current mode driver having a resistor coupled between a differential output terminals (referred to hereinafter as an H-bridge driver). However, the CML driver consumes more power. The voltage mode driver lacks design flexibility and is therefore unsuitable for transmitter (TX) equalizer design. Power efficiency of the H-bridge driver is higher than that of the CML driver but still lower than that of the voltage mode driver.

The application, U.S. application Ser. No. 14/280,701, of the same applicant provides a driver circuit having low power consumption and high design flexibility, however, this driver circuit still have power loss at output terminals, and the driver circuit is not allowed to operate as a pulse-amplitude modulation-4 (PAM-4) driver and a non-return-to-zero (NRZ) driver that have different number of output voltage levels.

SUMMARY

It is therefore an objective of the present invention to provide a driver circuit, which supports PAM-4 and NRZ code and having lower power consumption and high design flexibility, to solve the above-mentioned problems.

According to one embodiment of the present invention, a driver circuit for receiving input data and generating an output signal to a termination element is disclosed, wherein the input data has a first bit and second bit, one of the first bit and the second bit is a most significant bit (MSB), and the other one of the first bit and the second bit is a least significant bit (LSB), and the driver circuit comprises: a pair of differential output terminals, arranged for outputting the output signal, wherein the pair of differential output terminals has a first output terminal and a second output terminal; a first current mode drive unit, coupled to the pair of differential output terminals, for outputting a current from one of the first output terminal and the second output terminal, and receiving the current from the other of the first output terminal and the second output terminal according to the first bit; and a voltage mode drive unit, coupled to the pair of differential output terminals, for providing voltages to the first output terminal and the second output terminal according to at least the second bit.

According to another embodiment of the present invention, a control method of a driver circuit is disclosed, wherein the driver circuit receives input data and generates an output signal to a termination element, and the driver circuit comprises a pair of differential output terminals for outputting the output signal, wherein the input data has a first bit and second bit, one of the first bit and the second bit is a most significant bit (MSB), and the other one of the first bit and the second bit is a least significant bit (LSB), and the pair of differential output terminals having a first output terminal and a second output terminal, the control method comprises: providing a first current mode drive unit to output a current from one of the first output terminal and the second output terminal, and to receive the current from the other of the first output terminal and the second output terminal according to the first bit; and providing a voltage mode drive unit to provide voltages to the first output terminal and the second output terminal according to at least the second bit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
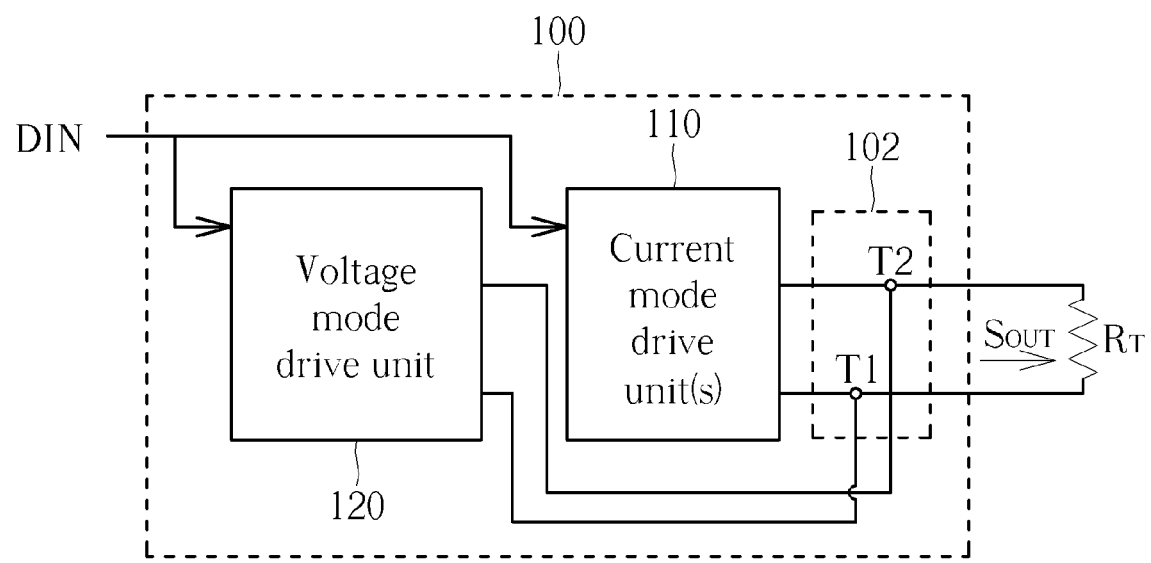
FIG. 1 is a block diagram illustrating an exemplary driver circuit according to an embodiment of the present invention.

Please refer to FIG. 1, which is a block diagram illustrating an exemplary driver circuit 100 according to an embodiment of the present invention. By way of example but not limitation, the driver circuit 100 may be employed in a SerDes transmitter. Specifically, the driver circuit 100 may receive input data DIN and generate an output signal $S_{OUT}$ to a termination element (implemented by a termination resistor $R_T$ in this embodiment), wherein the termination resistor $R_T$ may be located in a SerDes receiver (not shown in FIG. 1). The driver circuit 100 may include a pair of differential output terminals 102 (having an output terminal T1 and an output terminal T2), at least one current mode drive unit 110 and a voltage mode drive unit 120. The output signal $S_{OUT}$ may be regarded as a voltage difference between the output terminal T1 and the output terminal T2, and correspond to an output data logic (e.g. a logic "1" corresponding to a positive voltage or a logic "0" corresponding to a negative voltage in a NRZ mode; or "+1" and "+⅓" corresponding to positive voltages with different levels, and "−⅓" and "−1" corresponding to negative voltages with different levels in a PAM-4 mode).

The current mode drive unit 110 is coupled to the pair of differential output terminals 102, and is arranged for generating a current from one of the output terminal T1 and the output terminal T2 according to the input data DIN, and receive the current from the other of the output terminal T1 and the output terminal T2 according to the input data DIN. Specifically, after the current is outputted from one of the output terminal T1 and the output terminal T2, the current may flow through the termination resistor $R_T$ first, and then flows into the current mode drive unit 110 through the other of the output terminal T1 and the output terminal T2. In other words, the current mode drive unit 110 may change a direction of the current through the termination resistor $R_T$, thereby changing respective electric potentials of the output terminal T1 and the output terminal T2.

The voltage mode drive unit 120 is coupled to the pair of differential output terminals 102, and is arranged for providing voltages to the output terminal T1 and the output terminal T2 according to at least the according to the input data DIN, so that the output terminal T1 and the output terminal T2 may have different electric potentials to provide an output voltage required by the SerDes receiver.

The above is for illustrative purposes only, and is not meant to be a limitation of the present invention. In on implementation, the drive current outputted from the driver circuit 100 may come from the current mode drive unit 110 and the voltage mode drive unit 120. In other words, the drive current outputted from the driver circuit 100 may be a sum of the current and an output current of the voltage mode drive unit 120, wherein a ratio of the current to the drive current outputted from the driver circuit 100 may adjusted according to actual requirements/considerations.

In addition, in this embodiment, the driver circuit 100 is allowed to serve as a PAM-4 driver and a NRZ driver, that is the driver circuit 100 may generate four-level outputs for a PAM-4 mode or generate two-level outputs for a NRZ mode.

Figure 2:
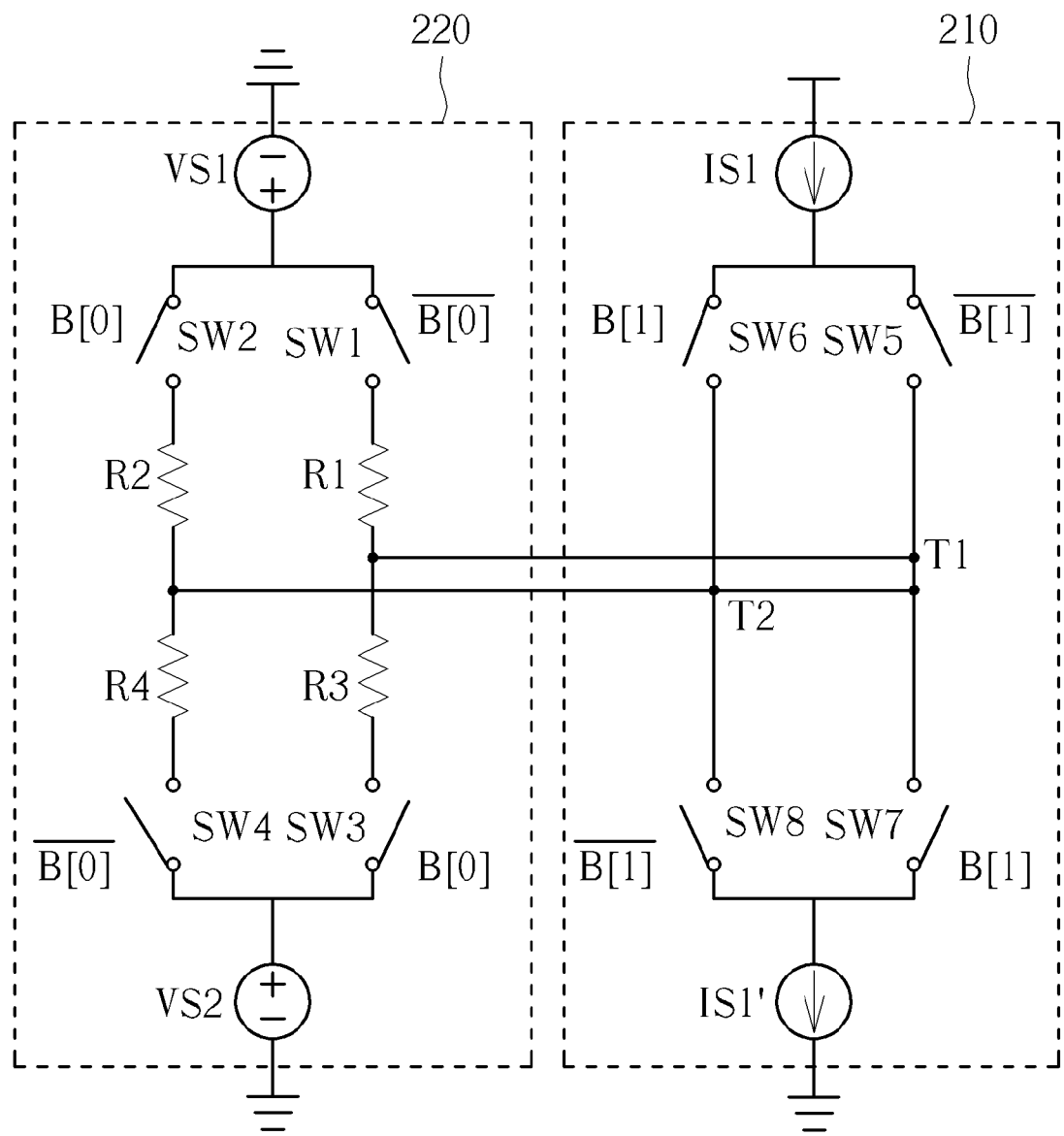
FIG. 2 is a diagram illustrating a driver circuit serving as a PAM-4 driver the according to a first embodiment of the present invention.

Please refer to FIG. 2, which is a diagram illustrating a driver circuit 200 serving as a PAM-4 driver (i.e. PAM-4 mode) the according to a first embodiment of the present invention. As shown in FIG. 2, the driver circuit 200 comprises a current mode drive unit 210, a voltage mode drive unit 220 and a pair of differential output terminals comprising two output terminal T1 and T2, and similar to FIG. 1 the output terminals T1 and T2 connects to the termination element $R_T$. The current mode drive unit 210 comprises a current source IS1, a current sink IS1' and a switch module, where the switch module comprises four switches SW5-SW8, and the switches SW5-SW8 are arranged to selectively couple the current source IS1 and the current sink IS1' to the output terminals T1 and T2. The voltage mode drive unit 220 comprises a first voltage source VS1, a second voltage source VS2, a switch module comprising four switches SW1-SW4, and four impedance elements R1-R4, where the switches SW1-SW4 are arranged to selectively couple the first voltage source VS1 and the second voltage source VS2 to the output terminals T1 and T2.

In this embodiment, not a limitation of the present invention, a current provided by the current source IS1 is the same as that of the current sink IS1', a first reference voltage provided by the first voltage source VS1 is greater than a second reference voltage provided by the second voltage source VS2, and each of the impedance elements R1-R4 has a resistance equal to 50 ohm.

When the driver circuit 200 serves as the PAM-4 driver, the driver circuit 200 is arranged to receive a most significant bit (MSB) B[1] and a least significant bit (LSB) B[0] to generate an output signal. In FIG. 2, the switches SW2 and SW3 are controlled by the LSB B[0], the switches SW1 and SW4 are controlled by an inverted phase of the LSB B[0], the switches SW6 and SW7 are controlled by the MSB B[1], and the switches SW5 and SW8 are controlled by an inverted phase of the MSB B[1], where when the LSB B[0] or the MSB B[1] has a logic value "1", the corresponding switch is switched on; and when the LSB B[0] or the MSB B[1] has a logic value "0", the corresponding switch is switched off. By using the circuit structure shown in FIG. 2, the driver circuit 200 may output four distinct voltage levels corresponding to four combinations (B[1], B[0])=(1, 1), (1, 0), (0, 1) and (0, 0), respectively. For example, not a limitation of the present invention, the driver circuit 200 outputs the highest voltage level (e.g. "+1") while (B[1], B[0])=(1, 1), the driver circuit 200 outputs the second highest voltage level (e.g. "+(⅓)") while (B[1], B[0])=(1, 0), the driver circuit 200 outputs the third highest voltage level (e.g. "−(⅓)") while (B[1], B[0])=(0, 1), and the driver circuit 200 outputs the lowest voltage level (e.g. "−1") while (B[1], B[0])=(0, 0).

When the driver circuit 200 serves as the NRZ driver (i.e. NRZ mode), there are only two types of input data: (B[1], B[0])=(1, 1) and (B[1], B[0])=(0, 0), that is the MSB B[1] is equal to the LSB B[0]. In the NRZ mode, the driver circuit 200 outputs the high voltage level (e.g. "+1") while (MSB, LSB)=(1, 1), and the driver circuit 200 outputs the low voltage level (e.g. "−1") while (MSB, LSB)=(0, 0).

Figure 3:
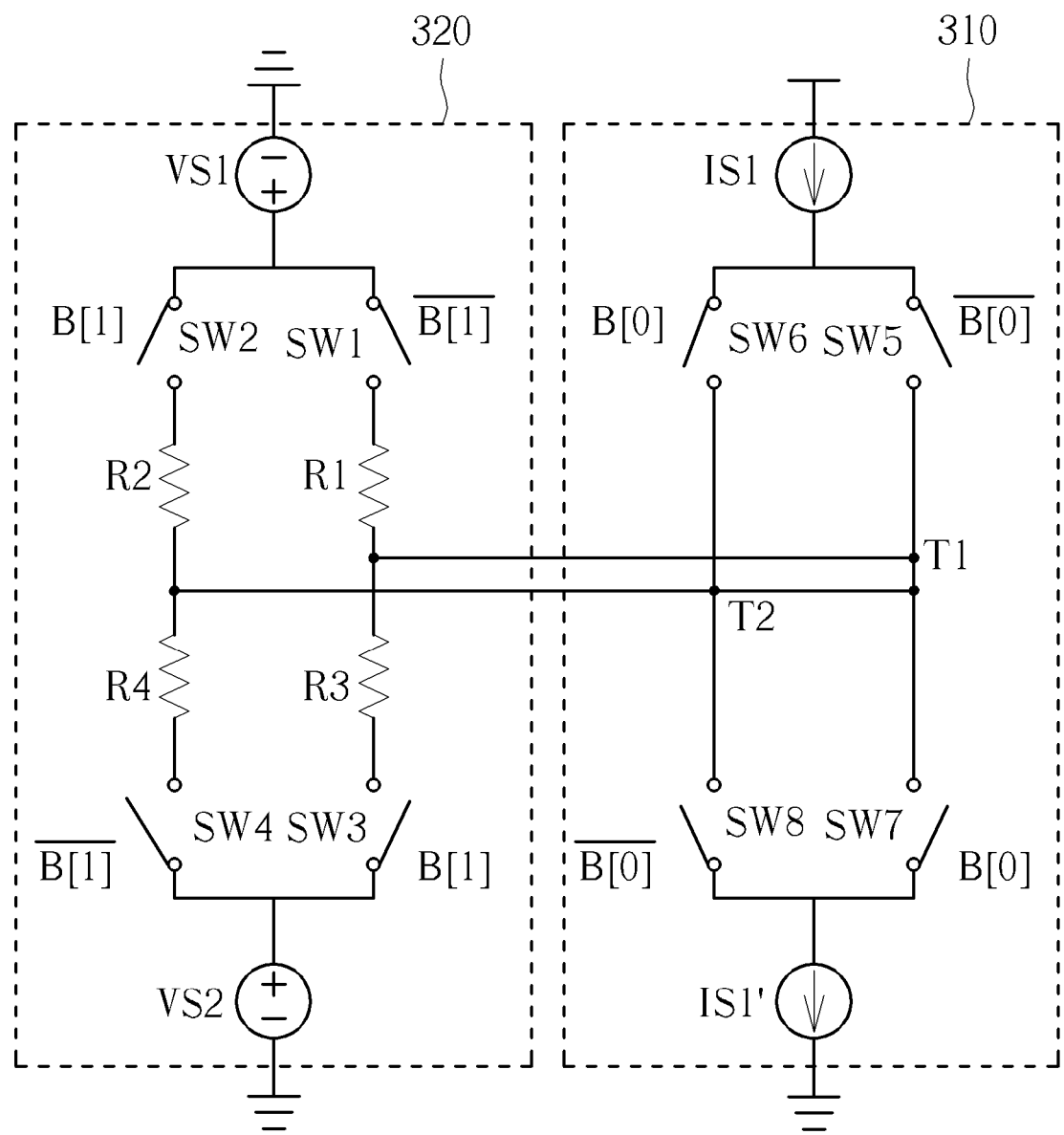
FIG. 3 is a diagram illustrating a driver circuit serving as a PAM-4 driver the according to a second embodiment of the present invention.

In the embodiment shown in FIG. 2, the current mode drive unit 110 receives the MSB, and the voltage mode drive unit 120 receives the LSB, however, in another embodiment of the present invention, the current mode drive unit may receive the LSB while the voltage mode drive unit receives the MSB. Refer to FIG. 3, which is a diagram illustrating a driver circuit 300 serving as a PAM-4 driver the according to a second embodiment of the present invention. As shown in FIG. 3, the driver circuit 300 comprises a current mode drive unit 310, a voltage mode drive unit 320 and a pair of differential output terminals comprising two output terminal T1 and T2, and similar to FIG. 1 the output terminals T1 and T2 connects to the termination element $R_T$. The current mode drive unit 310 comprises a current source IS1, a current sink IS1' and a switch module, where the switch module comprises four switches SW5-SW8, and the switches SW5-SW8 are arranged to selectively couple the current source IS1 and the current sink IS1' to the output terminals T1 and T2. The voltage mode drive unit 220 comprises a first voltage source VS1, a second voltage source VS2, a switch module comprising four switches SW1~SW4, and four impedance elements R1-R4, where the switches SW1~SW4 are arranged to selectively couple the first voltage source VS1 and the second voltage source VS2 to the output terminals T1 and T2.

In this embodiment, not a limitation of the present invention, a current provided by the current source IS1 is the same as that of the current sink IS1', a first reference voltage provided by the first voltage source VS1 is greater than a second reference voltage provided by the second voltage source VS2, and each of the impedance elements R1-R4 has a resistance equal to 50 ohm.

When the driver circuit 300 serves as the PAM-4 driver, the driver circuit 300 is arranged to receive a most significant bit (MSB) B[1] and a least significant bit (LSB) B[0] to generate an output signal. In FIG. 3, the switches SW2 and SW3 are controlled by the MSB B[1], the switches SW1 and SW4 are controlled by an inverted phase of the MSB B[1], the switches SW6 and SW7 are controlled by the LSB B[0], and the switches SW5 and SW8 are controlled by an inverted phase of the LSB B[0], where when the LSB B[0] or the MSB B[1] has a logic value "1", the corresponding switch is switched on; and when the LSB B[0] or the MSB B[1] has a logic value "0", the corresponding switch is switched off. By using the circuit structure shown in FIG. 3, the driver circuit 300 may output four distinct voltage levels corresponding to four combinations (B[1], B[0])=(1, 1), (1, 0), (0, 1) and (0, 0), respectively. For example, not a limitation of the present invention, the driver circuit 300 outputs the highest voltage level (e.g. "+1") while (B[1], B[0])=(1, 1), the driver circuit 300 outputs the second highest voltage level (e.g. "+(⅓)") while (B[1], B[0])=(1, 0), the driver circuit 200 outputs the third highest voltage level (e.g. "−(⅓)") while (B[1], B[0])=(0, 1), and the driver circuit 300 outputs the lowest voltage level (e.g. "−1") while (B[1], B[0])=(0, 0).

When the driver circuit 300 serves as the NRZ driver (i.e. NRZ mode), there are only two types of input data: (B[1], B[0])=(1, 1) and (B[1], B[0])=(0, 0), that is the MSB B[1] is equal to the LSB B[0]. In the NRZ mode, the driver circuit 300 outputs the high voltage level (e.g. "+1") while (MSB, LSB)=(1, 1), and the driver circuit 300 outputs the low voltage level (e.g. "−1") while (MSB, LSB)=(0, 0).

Figure 4:
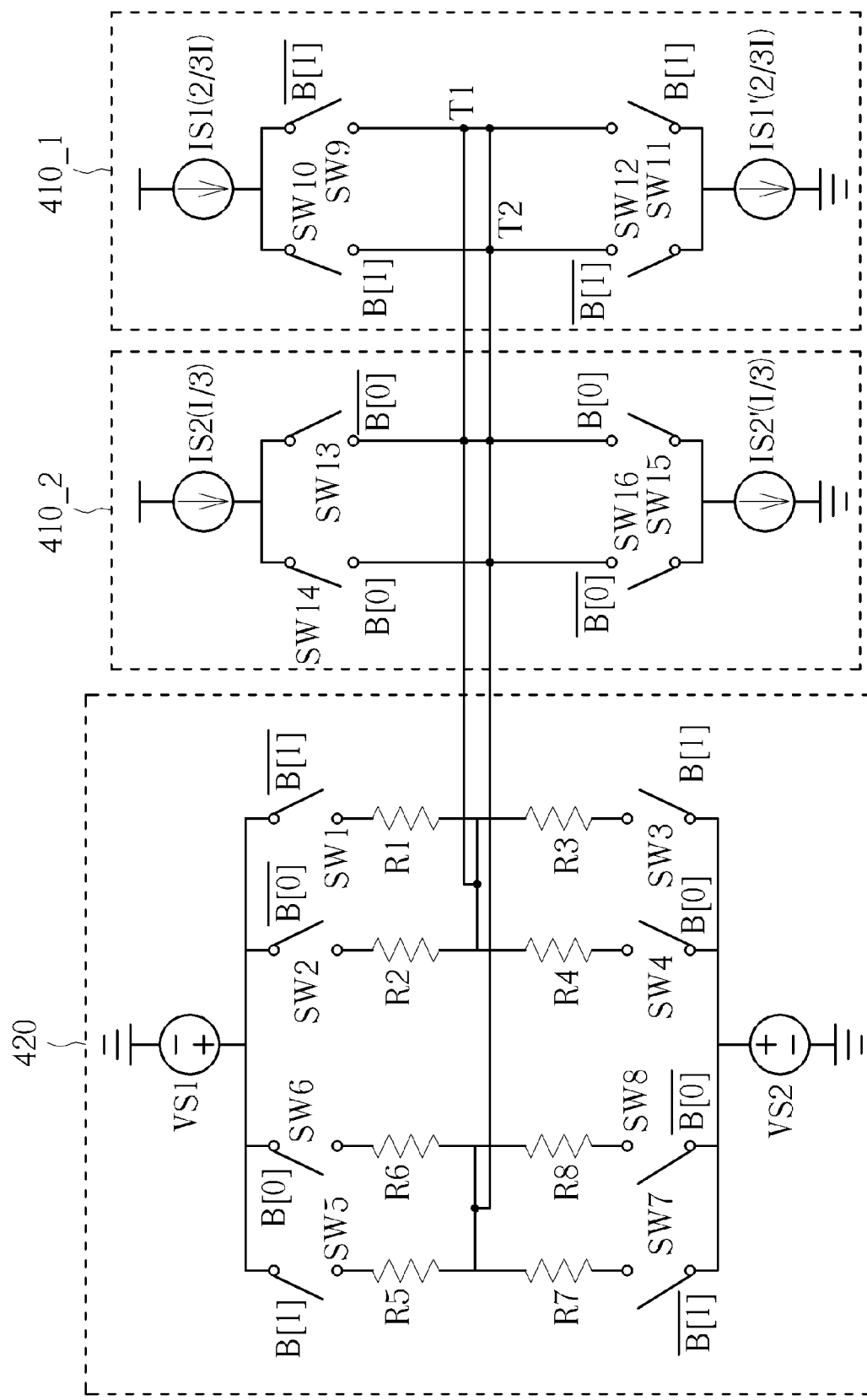
FIG. 4 is a diagram illustrating a driver circuit serving as a PAM-4 driver the according to a third embodiment of the present invention.

Please refer to FIG. 4, which is a diagram illustrating a driver circuit 400 serving as a PAM-4 driver the according to a third embodiment of the present invention. As shown in FIG. 4, the driver circuit 400 comprises a first current mode drive unit 410_1, a second current mode drive unit 410_2, a voltage mode drive unit 420 and a pair of differential output terminals comprising two output terminal T1 and T2, where the output terminals T1 and T2 connects to the termination element $R_T$ as shown in FIG. 1. The first current mode drive unit 410_1 comprises a first current source IS1, a first current sink IS1' and a first switch module, where the first switch module comprises four switches SW9-SW12, and the switches SW9-SW12 are arranged to selectively couple the first current source IS1 and the first current sink IS1' to the output terminals T1 and T2. The second current mode drive unit 410_2 comprises a second current source IS2, a second current sink IS2' and a second switch module, where the second switch module comprises four switches SW13-SW16, and the switches SW13-SW16 are arranged to selectively couple the second current source IS2 and the second current sink IS2' to the output terminals T1 and T2. The voltage mode drive unit 420 comprises a first voltage source VS1, a second voltage source VS2, a switch module comprising eight switches SW1-SW8, a first impedance circuit mode comprising four impedance elements R1-R4, and a second impedance circuit mode comprising four impedance elements R5-R8, where the switches SW1-SW8 are arranged to selectively couple the first voltage source VS1 and the second voltage source VS2 to the output terminals T1 and T2.

In this embodiment, a current provided by the first current source IS1 and the first current sink IS1' is equal to (⅔)*I, a current provided by the second current source IS2 and the second current sink IS2' is equal to (⅓)*I, where "I" can any suitable current value;

a first reference voltage provided by the first voltage source VS1 is greater than a second reference voltage provided by the second voltage source VS2; and each of the impedance elements R1, R3, R5 and R7 has a resistance equal to 75 ohm, and each of the impedance elements R2, R4, R6 and R8 has a resistance equal to 150 ohm. It is noted that the above arrangements are for illustrative purposes only, not limitations of the present invention.

When the driver circuit 400 serves as the PAM-4 driver, the driver circuit 400 is arranged to receive a most significant bit (MSB) B[1] and a least significant bit (LSB) B[0] to generate an output signal. In FIG. 4, the switches SW4, SW6, SW14 and SW15 are controlled by the LSB B[0], the switches SW2, SW8, SW13 and SW 16 are controlled by an inverted phase of the LSB B[0], the switches SW3, SW5, SW10 and SW11 are controlled by the MSB B[1], and the switches SW1, SW7, SW9 and SW12 are controlled by an inverted phase of the MSB B[1], where when the LSB B[0] or the MSB B[1] has a logic value "1", the corresponding switch is switched on; and when the LSB B[0] or the MSB B[1] has a logic value "0", the corresponding switch is switched off. By using the circuit structure shown in FIG. 4, the driver circuit 400 may output four distinct voltage levels corresponding to four combinations (B[1], B[0])=(1, 1), (1, 0), (0, 1) and (0, 0), respectively. For example, not a limitation of the present invention, the driver circuit 400 outputs the highest voltage level (e.g. "+1") while (B[1], B[0])=(1, 1), the driver circuit 400 outputs the second highest voltage level (e.g. "+(⅓)") while (B[1], B[0])=(1, 0), the driver circuit 400 outputs the third highest voltage level (e.g. "−(⅓)") while (B[1], B[0])=(0, 1), and the driver circuit 400 outputs the lowest voltage level (e.g. "−1") while (B[1], B[0])=(0, 0).

When the driver circuit 400 serves as the NRZ driver (i.e. NRZ mode), there are only two types of input data: (B[1], B[0])=(1, 1) and (B[1], B[0])=(0, 0), that is the MSB B[1] is equal to the LSB B[0]. In the NRZ mode, the driver circuit 300 outputs the high voltage level (e.g. "+1") while (MSB, LSB)=(1, 1), and the driver circuit 300 outputs the low voltage level (e.g. "−1") while (MSB, LSB)=(0, 0).

In the embodiments shown in FIG. 2, the current mode drive unit 210 receives the MSB while the voltage mode drive unit 220 receives the LSB; in the embodiments shown in FIG. 3, the current mode drive unit 310 receives the LSB while the voltage mode drive unit 320 receives the MSB; and in the embodiments shown in FIG. 4, the current mode drive units 410_1 and 410_2 receives both MSB and LSB while the voltage mode drive unit 420 receives both MSB and LSB. However, the driver circuit may also be implemented by modifying or combining the above-mentioned embodiments. For example, in a fourth embodiment of the present invention, the current mode drive unit may receive MSB or LSB while the voltage mode drive unit receives both MSB and LSB; and in a fifth embodiment of the present invention, the current mode drive unit may receive both MSB and LSB while the voltage mode drive unit receives MSB or LSB. Because a person skilled in the art should understand how to implement the fourth embodiment and the fifth embodiment after reading the aforementioned disclosure, further descriptions are omitted here.

Briefly summarized, in the driver circuit of the present invention, the driver circuit can serve as a PAM-4 driver or a NRZ driver to support PAM-4 and NRZ codes. Furthermore, the driver circuit of the present invention has lower power consumption and high design flexibility.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A driver circuit for receiving input data and generating an output signal to a termination element, wherein when the driver circuit operates as a first mode, the input data has a first bit and second bit, one of the first bit and the second bit is a most significant bit (MSB), and the other one of the first bit and the second bit is a least significant bit (LSB) and the driver circuit comprises:
   a pair of differential output terminals, arranged for outputting the output signal, wherein the pair of differential output terminals has a first output terminal and a second output terminal;
   a first current mode drive unit, coupled to the pair of differential output terminals, for outputting a current from one of the first output terminal and the second output terminal, and receiving the current from the other of the first output terminal and the second output terminal according to the first bit; and
   a voltage mode drive unit, coupled to the pair of differential output terminals, for providing voltages to the first output terminal and the second output terminal according to at least the second bit.

2. The driver circuit of claim 1, wherein the first current mode drive unit comprises:
   a current source;
   a current sink; and
   a switch module, coupled between the current source and the pair of differential output terminals, and coupled between the current sink and the pair of differential output terminals;
   wherein the current source is coupled to one of the first output terminal and the second output terminal via the switch module according to the first bit, and the current sink is coupled to the other one of the first output terminal and the second output terminal via the switch module according to the first bit.

3. The driver circuit of claim 1, wherein the voltage mode drive unit comprises:
   a first voltage source, for providing a first reference voltage;
   a second voltage source, for providing a second reference voltage; and
   a switch module, coupled between the first voltage source and the pair of differential output terminals, and coupled between the second voltage source and the pair of differential output terminals;
   wherein the first voltage source is coupled to one of the first output terminal and the second output terminal via the switch module according to the second bit, and the second voltage source is coupled to the other one of the first output terminal and the second output terminal via the switch module according to the second bit.

4. The driver circuit of claim 3, wherein the first voltage mode drive unit further comprises:
   a first impedance element, coupled between the first voltage source and the first output terminal;
   a second impedance element, coupled between the first voltage source and the second output terminal;
   a third impedance element, coupled between the second voltage source and the first output terminal; and
   a fourth impedance element, coupled between the second voltage source and the second output terminal;
   wherein the first impedance element, the second impedance element, the third impedance element and the fourth impedance element have the same resistance.

5. The driver circuit of claim 1, further comprising:
   a second current mode drive unit, coupled to the pair of differential output terminals;
   wherein the first current mode drive unit and the second current mode drive unit are arranged for outputting the current from one of the first output terminal and the second output terminal, and receiving the current from the other of the first output terminal and the second output terminal according to the first bit and the second bit.

6. The driver circuit of claim 5, wherein
   the first current mode drive unit comprises:
      a first current source;
      a first current sink; and
      a first switch module, coupled between the first current source and the pair of differential output terminals, and coupled between the first current sink and the pair of differential output terminals; and
   the second current mode drive unit comprises:
      a second current source;
      a second current sink; and
      a second switch module, coupled between the second current source and the pair of differential output terminals, and coupled between the second current sink and the pair of differential output terminals;
   wherein the first current source is coupled to one of the first output terminal and the second output terminal via the first switch module according to the second bit, and the first current sink is coupled to the other one of the first output terminal and the second output terminal via the first switch module according to the second bit; and the second current source is coupled to one of the first output terminal and the second output terminal via the second switch module according to the first bit, and the second current sink is coupled to the other one of the first output terminal and the second output terminal via the second switch module according to the first bit.

7. The driver circuit of claim 6, wherein a current provided by the first current source is twice that of the second current source.

8. The driver circuit of claim 1, wherein the voltage mode drive unit provides the voltages to the first output terminal and the second output terminal according to both the first bit and the second bit.

9. The driver circuit of claim 8, wherein the voltage mode drive unit comprises:
   a first voltage source, for providing a first reference voltage;
   a second voltage source, for providing a second reference voltage;
   a switch module, coupled between the first voltage source and the pair of differential output terminals, and coupled between the second voltage source and the pair of differential output terminals;
   a first impedance circuit module, coupled between the switch module and the first output terminal; and
   a second impedance circuit module, coupled between the switch module and the second output terminal.

10. The driver circuit of claim 9, wherein
    the first impedance circuit module comprises:
       a first impedance element, coupled between the first voltage source and the first output terminal;
       a second impedance element, coupled between the first voltage source and the first output terminal;

a third impedance element, coupled between the second voltage source and the first output terminal; and a fourth impedance element, coupled between the second voltage source and the first output terminal; and the second impedance circuit module comprises:

a fifth impedance element, coupled between the first voltage source and the second output terminal;

a sixth impedance element, coupled between the first voltage source and the second output terminal;

a seventh impedance element, coupled between the second voltage source and the second output terminal; and an eighth impedance element, coupled between the second voltage source and the second output terminal.

11. The driver circuit of claim 10, wherein the first voltage source is selectively coupled to the first impedance element or the fifth impedance element according to the second bit, the first voltage source is selectively coupled to the second impedance element or the sixth impedance element according to the first bit, the second voltage source is selectively coupled to the third impedance element or the seventh impedance element according to the second bit, and the second voltage source is selectively coupled to the fourth impedance element or the eighth impedance element according to the first bit.

12. The driver circuit of claim 10, wherein the first impedance element and the third impedance element have the same resistance, and the second impedance element and the fourth impedance element have the same resistance.

13. The driver circuit of claim 10, wherein a resistance of the second impedance element is twice that of the first impedance element, and a resistance of the fourth impedance element is twice that of the third impedance element.

14. The driver circuit of claim 10, further comprising:

a second current mode drive unit, coupled to the pair of differential output terminals;

wherein the first current mode drive unit and the second current mode drive unit are arranged for outputting the current from one of the first output terminal and the second output terminal, and receiving the current from the other of the first output terminal and the second output terminal according to the first bit and the second bit.

15. The driver circuit of claim 14, wherein the first current mode drive unit comprises:

a first current source;

a first current sink; and a first switch module, coupled between the first current source and the pair of differential output terminals, and coupled between the first current sink and the pair of differential output terminals; and the second current mode drive unit comprises:

a second current source;

a second current sink; and a second switch module, coupled between the second current source and the pair of differential output terminals, and coupled between the second current sink and the pair of differential output terminals;

wherein the first current source is coupled to one of the first output terminal and the second output terminal via the first switch module according to the second bit, and the first current sink is coupled to the other one of the first output terminal and the second output terminal via the first switch module according to the second bit; and the second current source is coupled to one of the first output terminal and the second output terminal via the second switch module according to the first bit, and the second current sink is coupled to the other one of the first output terminal and the second output terminal via the second switch module according to the first bit.

16. The driver circuit of claim 15, wherein a current provided by the first current source is twice that of the second current source; and resistances of the second impedance element, fourth impedance element, sixth impedance element and eighth impedance element are twice that of the first impedance element, third impedance element, fifth impedance element and seventh impedance element, respectively.

17. The driver circuit of claim 1, wherein the first mode is a pulse-amplitude modulation-4 (PAM-4) mode, and the driver circuit further supports a non-return-to-zero (NRZ) mode.

18. A control method of a driver circuit, the driver circuit receiving input data and generating an output signal to a termination element, and the driver circuit comprising a pair of differential output terminals for outputting the output signal, wherein the input data has a first bit and second bit, one of the first bit and the second bit is a most significant bit (MSB), and the other one of the first bit and the second bit is a least significant bit (LSB), and the pair of differential output terminals having a first output terminal and a second output terminal, the control method comprising:

providing a first current mode drive unit to output a current from one of the first output terminal and the second output terminal, and to receive the current from the other of the first output terminal and the second output terminal according to the first bit; and providing a voltage mode drive unit to provide voltages to the first output terminal and the second output terminal according to at least the second bit.

19. The control method of claim 18, wherein the driver circuit supports a pulse-amplitude modulation-4 (PAM-4) and non-return-to-zero (NRZ) line code.

* * * * *